(12) United States Patent
Minamio et al.

(10) Patent No.: US 7,834,926 B2
(45) Date of Patent: Nov. 16, 2010

(54) SEMICONDUCTOR IMAGE SENSING ELEMENT AND FABRICATION METHOD THEREFOR, AND SEMICONDUCTOR IMAGE SENSING DEVICE AND FABRICATION METHOD THEREFOR

(75) Inventors: Masanori Minamio, Osaka (JP); Tomoko Komatsu, Kyoto (JP); Kiyokazu Itoi, Osaka (JP); Toshiyuki Fukuda, Kyoto (JP)

(73) Assignee: Panasonic Corporation, Osaka (JP)

( * ) Notice: Subject to any disclaimer, the term of this patent is extended or adjusted under 35 U.S.C. 154(b) by 684 days.

(21) Appl. No.: 11/540,753

(22) Filed: Oct. 2, 2006

(65) Prior Publication Data

US 2007/0109439 A1    May 17, 2007

(30) Foreign Application Priority Data

Nov. 17, 2005    (JP)    ............... 2005-332247

(51) Int. Cl.
*H04N 5/225* (2006.01)
*G02B 26/00* (2006.01)
*G02F 1/00* (2006.01)
*H01L 21/00* (2006.01)

(52) U.S. Cl. .................. 348/340; 359/237; 438/64

(58) Field of Classification Search .............. 348/340, 348/376; 359/237; 438/64, 436, 452, 457
See application file for complete search history.

(56) References Cited

U.S. PATENT DOCUMENTS

| 7,616,250 | B2 * | 11/2009 | Watanabe et al. | ............ 348/340 |
| 2004/0032523 | A1 * | 2/2004 | Hartlove et al. | ............ 348/340 |
| 2005/0041134 | A1 * | 2/2005 | Takayama | ................... 348/340 |
| 2005/0219398 | A1 * | 10/2005 | Sato et al. | .................... 348/340 |
| 2005/0275741 | A1 * | 12/2005 | Watanabe et al. | ............ 348/340 |

FOREIGN PATENT DOCUMENTS

| JP | 5-102449 | 4/1993 |
| JP | 2004-111792 | 4/2004 |

* cited by examiner

*Primary Examiner*—Kelly L Jerabek
(74) *Attorney, Agent, or Firm*—McDermott Will & Emery LLP

(57) ABSTRACT

A semiconductor image sensing element has a semiconductor element including an image sensing area, a peripheral circuit region, a plurality of electrode portions provided in the peripheral circuit region, and a plurality of micro-lenses provided on the image sensing area and an optical member having a configuration covering at least the image sensing area and bonded over the micro-lenses via a transparent bonding member. The side surface region of the optical member is formed with a light shielding film for preventing the irradiation of the image sensing area with a reflected light beam or a scattered light beam from the side surface region.

20 Claims, 14 Drawing Sheets

UV Light Beam

UV Light Beam

SEMICONDUCTOR IMAGE SENSING ELEMENT AND FABRICATION METHOD THEREFOR, AND SEMICONDUCTOR IMAGE SENSING DEVICE AND FABRICATION METHOD THEREFOR

CROSS REFERENCE TO RELATED APPLICATIONS

The teachings of Japanese Patent Application JP 2005-332247, filed Nov. 17, 2005, are entirely incorporated herein by reference, inclusive of the specification, drawings, and claims.

BACKGROUND OF THE INVENTION

The present invention relates to a semiconductor image sensing element having an optical member bonded directly to the image sensing area thereof and a fabrication method therefor, and to a semiconductor image sensing device and a fabricating method therefor. More particularly, the present invention relates to a structure which cuts off a light beam incident from a side surface of an optical member.

In recent years, as electronic equipment has been increasingly reduced in size, thickness, and weight, there has been stronger demand for a more densely packed semiconductor device. In accordance with the trend toward higher integration of a semiconductor element promoted by the advancement of microfabrication technologies, a so-called chip mounting technology which directly mounts a chip size package or a bare-chip semiconductor element has been proposed. Such trends are the same also in a semiconductor image sensing device and various structures have been proposed.

For example, there has been proposed a method for fabricating semiconductor packages which are constructed to have no through-hole conducting portion to prevent the fabrication process thereof from being complicated by the provision of through holes and which can also be thinned and simultaneously fabricated (see, e.g., Japanese Laid-Open Patent Publication No. 2004-111792).

Each of the semiconductor packages fabricated by the method comprises: a semiconductor substrate having a device region on one surface thereof and connection pads connected to the device region; a support substrate provided on the one surface of the semiconductor substrate; external electrodes provided on the other surface of the semiconductor substrate; and connecting means having a part thereof extending outwardly from the periphery of the semiconductor substrate and providing electrical connection between the connection pads and the external electrodes. In the structure, an image sensing area and the support substrate are provided on the one surface of the semiconductor substrate having the connection pads connected to the image sensing area, while columnar electrodes are provided on the other surface thereof. The arrangement allows the formation of the structure that can be thinned and has no through-hole conducting portion since the connecting means providing electrical connection between the connection pads and the columnar electrodes is partly extended outwardly from the periphery of the semiconductor substrate. In addition, since the connecting means and the columnar electrodes of the plurality of semiconductor substrates can be formed simultaneously, the productivity can be reportedly improved.

A solid-state image sensing device free from the occurrence of flare, smear, or the like irrespective of its structure molded with a resin and highly reliable in terms of moist resistance, mechanical strength, and the like and a fabrication method therefor have also been proposed (see, e.g., Japanese Laid-Open Patent Publication No. HEI 05-102449).

The solid-state image sensing device according to this example is comprised of a structure obtained by entirely molding a solid-state image sensing element wired on a lead frame with a transparent resin and covering the outer circumferential surfaces of the transparent resin, except for at least the surface thereof corresponding to a valid pixel area, with a black resin. The fabrication method for the solid-state image sensing device comprises the steps of: molding the entire solid-state image sensing element wired on the lead frame with the transparent resin; covering the entire transparent resin with the black resin; and locally removing the black resin from over the valid pixel area of the solid-state image sensing element.

In such a structure, the solid-state image sensing element molded with the transparent resin is covered with the black resin except for at least the surface thereof corresponding to the valid pixel area. Accordingly, the black resin shields the solid-state image sensing element from a light beam, except for the light receiving surface thereof. This prevents flare, smear, and the like which adversely affect an image sensed by the solid-state image sensing device. It is also reported that the formation of the light receiving surface achieved by integrally molding the solid-state image sensing element with the transparent resin, covering the transparent resin with the black resin, and locally removing the black resin from over the valid pixel area allows easy fabrication of a highly reliable resin-molded solid-state image sensing device.

SUMMARY OF THE INVENTION

In the semiconductor image sensing device according to the first example mentioned above, the optical member such as a glass substrate is bonded to at least the surface of the semiconductor substrate which has the image sensing area by using a transparent bonding layer made of a transparent epoxy resin. In such a structure, however, there is a case where an incident light beam impinges on wiring for connection on the surface of the semiconductor image sensing element and the reflected light beam therefrom is further reflected by the transparent bonding layer and the optical member so that the reflected light beam is incident on the image sensing area. When such a phenomenon occurs, optical noise occurs and significantly degrades the quality of the semiconductor image sensing device.

In the semiconductor image sensing device according to the second example, the solid-state image sensing element wired on the lead frame is entirely molded with the transparent resin and the outer circumferential surfaces of the transparent resin, except for at least the surface thereof corresponding to the valid pixel area, is covered with the black resin. However, the transparent resin layer is exposed at the image sensing surface including gold wire portions, which are metal thin wires. This is because the image sensing surface is polished after the transparent resin is entirely covered with the black resin. In this structure, however, a light beam incident from the transparent resin surface impinges on the gold wires and is reflected therefrom so that the reflected light beam is incident on the image sensing area. As a result, flare or smear may occasionally occur in an image and the problem is encountered that flare and smear cannot be reliably prevented.

It is therefore an object of the present invention to provide a semiconductor image sensing element which is thin, compact, and easy to fabricate and also allows reliable prevention of optical noise and a fabrication method therefor, and a semiconductor image sensing device and a fabrication method therefor.

To solve the problem described above, a first semiconductor image sensing element according to the present invention comprises: a semiconductor element having an image sensing area, a peripheral circuit region, a plurality of electrode portions provided in the peripheral circuit region, and a plurality of micro-lenses provided on the image sensing area; and an optical member having a configuration covering at least the image sensing area and bonded over the micro-lenses via a transparent bonding member, wherein at least one of a light shielding film and a light shielding pattern is provided on a side surface region of the optical member to serve as a light shielding portion for preventing the image sensing area from being irradiated with a reflected light beam or a scattered light beam from the side surface region.

In the arrangement, at least one of the light shielding film and the light shielding pattern is formed on the side surface region of the optical member so that a reflected light beam or a scattered light beam is prevented from being incident on the image sensing area from the side surface region of the optical member. As a result, optical noise such as flare or smear can be reliably prevented. Since the optical member is bonded directly over the micro-lenses on the image sensing area by using the transparent bonding member, a thin and compact semiconductor image sensing element can be implemented. For the transparent bonding member, a material having either or both of a UV setting property and a thermosetting property can be used by way of example. The transparent bonding member can be formed by a drawing method, a printing method, or the like.

A second semiconductor image sensing element according to the present invention comprises: a semiconductor element having an image sensing area, a plurality of electrode portions, and a plurality of micro-lenses provided on the image sensing area; an optical member having a configuration covering at least the image sensing area and bonded over the micro-lenses via a transparent bonding member; and a light shielding member formed on an exposed region of the transparent bonding member, on a side surface region of the optical member, and on a surface of a peripheral circuit region to have openings for exposing the electrode portions.

In the arrangement, the light shielding member is formed on the surface of the peripheral circuit region including the exposed region of the transparent bonding member and the side surface region of the optical member, except for the electrode portions. As a result, a reflected light beam or a scattered light beam is prevented from being incident on the image sensing area from the side surface region of the optical member. Therefore, optical noise such as flare or smear can be reliably prevented. Since the optical member is bonded directly over the micro-lenses on the image sensing area by using the transparent bonding member, a thin and compact semiconductor image sensing element can be implemented. For the transparent bonding member, a material having either or both of a UV setting property and a thermosetting property can be used by way of example. The transparent bonding member can be formed by a drawing method, a printing method, or the like.

In the structure described above, the side surface region of the optical member may be configured to tilt with respect to a light receiving surface. Alternatively, the side surface region of the optical member may be formed into a rough surface. The arrangement can more reliably prevent the incidence of a reflected light beam or a scattered light beam on the image sensing area from the side surface region of the optical member.

In the structure described above, a material of the optical member may be made of Pyrex (registered trademark) glass, Terex glass, quartz, an acrylic resin, or an epoxy resin. Since the arrangement allows the use of a relatively hard material, bonding can be performed with excellent parallelism to the image sensing area. In addition, an external light beam is allowed to be efficiently incident on the image sensing area due to less absorption of the light beam.

In the structure described above, bumps may be formed on respective surfaces of the electrode portions of the semiconductor element. The arrangement makes it possible to implement a more compact and thinner semiconductor image sensing device by mounting the semiconductor image sensing element on a mounting substrate by a face-down mounting method.

A first method for fabricating a semiconductor image sensing element according to the present invention comprises the steps of: preparing a semiconductor wafer on which semiconductor elements each having an image sensing area, a peripheral circuit region, a plurality of electrode portions disposed in the peripheral circuit region, and a plurality of micro-lenses provided on the image sensing area are arranged as an array; forming at least one of a light shielding film and a light shielding pattern on a side surface of each of optical members having a configuration covering at least the image sensing area; forming a transparent bonding member on the image sensing area of each of the individual semiconductor elements on the semiconductor wafer; aligning the optical members with respect to the individual image sensing areas and bonding the optical members to the individual semiconductor elements by using the transparent bonding members; and cutting the semiconductor wafer into the separate individual semiconductor elements.

The method allows the semiconductor image sensing element having a structure which prevents the incidence of a reflected light beam or a scattered light beam on the image sensing area from the side surface region of the optical member to be fabricated with a high yield and in simple process steps. For the transparent bonding member, a material having either or both of a UV setting property and a thermosetting property can be used by way of example. The transparent bonding member can be formed by a drawing method, a printing method, or the like. The optical member can be bonded by using the transparent bonding member and by using either or both of a UV irradiation method and a heating method, while the parallelism of the upper surface of the optical member to the image sensing area is maintained.

In the case of bonding the optical member to each of the semiconductor image sensing elements on the semiconductor wafer, it is also possible to perform an electric test and the like with respect thereto and bond only the semiconductor image sensing elements that have been determined to be acceptable. A test can further be performed after bonding.

A second method for fabricating a semiconductor image sensing element according to the present invention comprises the steps of: preparing a semiconductor wafer on which semiconductor elements each having an image sensing area, a plurality of electrode portions, and a plurality of micro-lenses provided on the image sensing area are arranged as an array; forming optical members each having a configuration covering at least the image sensing area; forming a transparent bonding member on the image sensing area of each of the individual semiconductor elements on the semiconductor wafer; aligning the optical members with respect to the individual image sensing areas and bonding the optical members to the individual semiconductor elements by using the transparent bonding members; forming a light shielding member on an exposed region of the transparent bonding member over each of the semiconductor elements and on a side surface region of each of the optical members to form openings for exposing the electrode portions; and cutting the semiconductor wafer into the separate individual semiconductor elements.

The method allows the semiconductor image sensing element having a structure which prevents the incidence of a reflected light beam or a scattered light beam on the image sensing area from the side surface region of the optical member to be fabricated with a high yield and in simple process steps. For the transparent bonding member, a material having either or both of a UV setting property and a thermosetting property can be used by way of example. The transparent bonding member can be formed by a drawing method, a printing method, or the like. The optical member can be bonded by using the transparent bonding member and by using either or both of a UV irradiation method and a heating method, while the parallelism of the upper surface of the optical member to the image sensing area is maintained. The light shielding member can be formed of a paste-like resin material by a drawing method or the like. The light shielding member can also be cured by using either or both of a UV irradiation method and a heating method.

In the case of bonding the optical member to each of the semiconductor image sensing elements on the semiconductor wafer, it is also possible to perform an electric test and the like with respect thereto and bond only the semiconductor image sensing elements that have been determined to be acceptable. A test can further be performed after bonding.

A third method for fabricating a semiconductor image sensing element according to the present invention comprises the steps of: preparing a semiconductor wafer on which semiconductor elements each having an image sensing area, a plurality of electrode portions, and a plurality of micro-lenses provided on the image sensing area are arranged as an array; forming a light shielding film or a light shielding pattern on a side surface of each of optical members having a configuration covering at least the image sensing area; forming a transparent bonding member on the image sensing area of each of the individual semiconductor elements of the semiconductor wafer; aligning the optical members with respect to the individual image sensing areas and bonding the optical members to the individual semiconductor elements by using the transparent bonding members; cutting the semiconductor wafer into the separate individual semiconductor elements; and forming bumps on the electrode portions of each of the semiconductor elements.

The method allows a face-down-mounted-type semiconductor image sensing element having a structure which prevents the incidence of a reflected light beam or a scattered light beam on the image sensing area from the side surface region of the optical member to be fabricated with a high yield and in simple process steps. For the transparent bonding member, a material having either or both of a UV setting property and a thermosetting property can be used by way of example. The transparent bonding member can be formed by a drawing method, a printing method, or the like. The optical member can be bonded by using the transparent bonding member and by using either or both of a UV irradiation method and a heating method, while the parallelism of the upper surface of the optical member to the image sensing area is maintained.

In the case of bonding the optical member to each of the semiconductor image sensing elements on the semiconductor wafer, it is also possible to perform an electric test and the like with respect thereto and bond only the semiconductor image sensing elements that have been determined to be acceptable. A test can further be performed after bonding.

A fourth method for fabricating a semiconductor image sensing element according to the present invention comprises: the steps of: preparing a semiconductor wafer on which semiconductor elements each having an image sensing area, a plurality of electrode portions, and a plurality of micro-lenses provided on the image sensing area are arranged as an array; forming optical members each having a configuration covering at least the image sensing area; forming a transparent bonding member on the image sensing area of each of the individual semiconductor elements on the semiconductor wafer; aligning the optical members with respect to the individual image sensing areas and bonding the optical members to the individual semiconductor elements by using the transparent bonding members; forming a light shielding member on a surface of a peripheral circuit region including an exposed region of the transparent bonding member over each of the semiconductor elements and a side surface region of each of the optical members to form openings for exposing the electrode portions; cutting the semiconductor wafer into the separate individual semiconductor elements; and forming bumps on the electrode portions of each of the semiconductor elements.

The arrangement allows the semiconductor image sensing element having a structure in which the light shielding member is formed on the surface of the peripheral circuit region including the exposed region of the transparent bonding member and the side surface region of the optical member, except for the electrode portions, to be fabricated in simple process steps. In addition, the arrangement can prevent a reflected light beam or a scattered light beam from being incident on the image sensing area from the side surface region of the optical member. As a result, it becomes possible to prevent optical noise such as flare or smear and fabricate a semiconductor image sensing element having excellent properties. Since the optical member is bonded directly over the micro-lenses on the image sensing area by using the transparent bonding member, a thin and compact semiconductor image sensing element can be implemented. For the transparent bonding member, a material having either or both of a UV setting property and a thermosetting property can be used by way of example. The transparent bonding member can be formed by a drawing method, a printing method, or the like.

In the case of bonding the optical member to each of the semiconductor image sensing elements on the semiconductor wafer, it is also possible to perform an electric test and the like with respect thereto and bond only the semiconductor image sensing elements that have been determined to be acceptable. A test can further be performed after bonding.

A first semiconductor image sensing device according to the present invention comprises: a semiconductor image sensing element; a package having a mounting portion to which the semiconductor image sensing element is fixed and metal thin wire connection portions; a fastening member for fastening the semiconductor image sensing element to the mounting portion of the package; metal thin wires for providing connection between the electrode portions of the semiconductor image sensing element and the metal thin wire connection portions; and a burying resin for burying the metal thin wires therein and protecting the metal thin wires and is made of a structure using the semiconductor image sensing element described above. In this structure, an inner wall of the package may be formed into a rough surface configuration.

The arrangement can prevent optical noise such as flare or smear and implement a thin and compact semiconductor image sensing device having excellent properties.

A second semiconductor image sensing device according to the present invention comprises: a semiconductor image sensing element; a mounting substrate having an opening wider than at least an image sensing area of the semiconductor image sensing element and having electrode terminals arranged around the opening to be connected to electrode portions of the semiconductor image sensing element by a face-down mounting method; and a molding resin formed on a mounting region between the mounting substrate and the semiconductor image sensing element connected to the electrode terminals via bumps provided on respective surfaces of the electrode portions of the semiconductor image sensing element and on a portion of the mounting substrate which is adjacent to this mounting region and is made of a structure using the semiconductor image sensing element described above.

The arrangement can prevent optical noise such as flare or smear and implement a semiconductor image sensing device having excellent properties. In addition, since the semiconductor image sensing element is mounted on the mounting substrate by a face-down mounting method using bumps, a thinner and more compact semiconductor image sensing device can be implemented.

A third semiconductor image sensing device according to the present invention comprises: a semiconductor image sensing element; a mounting substrate having an opening wider than at least an image sensing area of the semiconductor image sensing element and having electrode terminals arranged around the opening to be connected to electrode portions of the semiconductor image sensing element by a face-down mounting method; and a molding resin formed on a mounting region between the mounting substrate and the semiconductor image sensing element connected to the electrode terminals via bumps provided on respective surfaces of the electrode portions of the semiconductor image sensing element and on a portion of the mounting substrate which is adjacent to the mounting region, wherein the semiconductor image sensing element comprises a semiconductor element including the image sensing area, a peripheral circuit region, the plurality of electrode portions provided in the peripheral circuit region, and a plurality of micro-lenses provided on the image sensing area and an optical member having a configuration covering at least the image sensing area and bonded over the micro-lenses via a transparent bonding member and the molding resin covers the electrode portions, the bumps, and the electrode terminals and is formed by using a material which cuts off at least a visible light beam and cures with an application of a UV light beam or heat.

In the arrangement, the molding resin can prevent a reflected light beam or a scattered light beam from being incident on the image sensing area from the side surface region of the optical member and causing flare, smear, or the like. As a result, it becomes possible to implement a semiconductor image sensing device having excellent properties. Since the semiconductor image sensing element is mounted on the mounting substrate by a face-down mounting method using bumps, a thinner and more compact semiconductor image sensing device can be implemented. The semiconductor image sensing element can be securely fixed to the mounting substrate by injecting a molding resin and curing the surface layer thereof, while irradiating the molding resin with a UV light beam through the opening of the mounting substrate, and then thermally or naturally curing the molding resin.

A first method for fabricating a semiconductor image sensing device according to the present invention comprises the steps of: fabricating a semiconductor image sensing element; fastening the semiconductor image sensing element onto a mounting portion of a package to which the semiconductor image sensing element is fixed by using a fastening member; providing connection between the electrode portions of the semiconductor image sensing element and metal thin wire connection portions provided on the package by using metal thin wires; and forming a burying resin for burying the metal thin wires therein and protecting the metal thin wires, wherein the step of fabricating the semiconductor image sensing element is made of the fabrication method described above.

The method prevents flare, smear, or the like and allows a semiconductor image sensing device having excellent properties to be fabricated in simple and easy steps.

A second method for fabricating a semiconductor image sensing device according to the present invention comprises the steps of: fabricating a semiconductor image sensing element; providing connection between electrode portions of the semiconductor image sensing element and electrode terminals of a mounting substrate having an opening wider than at least an image sensing area of the semiconductor image sensing element and having the electrode terminals arranged around the opening to be connected to the electrode portions of the semiconductor image sensing element by a face-down mounting method by using bumps provided on respective surfaces of the electrode portions; and forming a molding resin on a mounting region between the semiconductor image sensing element and the mounting substrate and on a portion of the mounting substrate which is adjacent to the mounting region, wherein the step of fabricating the semiconductor image sensing element is made of the method described above.

The method prevents flare, smear, or the like and allows a semiconductor image sensing device having excellent properties to be fabricated in simple and easy steps. It is also possible to fabricate a thinner and more compact semiconductor image sensing device by mounting the semiconductor image sensing element by a face-down mounting method.

A third method for fabricating a semiconductor image sensing device according to the present invention comprises the steps of: fabricating a semiconductor image sensing element; providing connection between electrode portions of the semiconductor image sensing element and a mounting substrate having an opening wider than at least an image sensing area of the semiconductor image sensing element and having electrode terminals arranged around the opening to be connected to the electrode portions of the semiconductor image sensing element by a face-down mounting method by using bumps provided on respective surfaces of the electrode portions of the semiconductor image sensing element; and forming a molding resin on a mounting region between the semiconductor image sensing element and the mounting substrate and on a portion of the mounting substrate which is adjacent to the mounting region, wherein the semiconductor image sensing element comprises a semiconductor element including the image sensing area, a peripheral circuit region, the plurality of electrode portions provided in the peripheral circuit region, and a plurality of micro-lenses provided on the image sensing area and an optical member having a configuration covering at least the image sensing area and bonded over the micro-lenses via a transparent bonding member and the molding resin covers the electrode portions, the bumps, and the electrode terminals and is made by using a material which cuts off at least a visible light beam and cures with an application of a UV light beam or heat.

The method can prevent the occurrence of flare, smear, or the like through a simple and easy process step of merely injecting a molding resin having a property of cutting off a visible light beam and allows low-cost fabrication of a semiconductor image sensing device having excellent properties. Since the semiconductor image sensing element is mounted on the mounting substrate by a face-down mounting method using bumps, a thinner and more compact semiconductor image sensing device can be implemented. The semiconductor image sensing element can be securely fixed to the mounting substrate by injecting the molding resin and curing the surface layer thereof, while irradiating the molding resin with a UV light beam through the opening of the mounting substrate, and then thermally or naturally curing the molding resin.

DETAILED DESCRIPTION OF THE PREFERRED EMBODIMENTS

Figure 1:
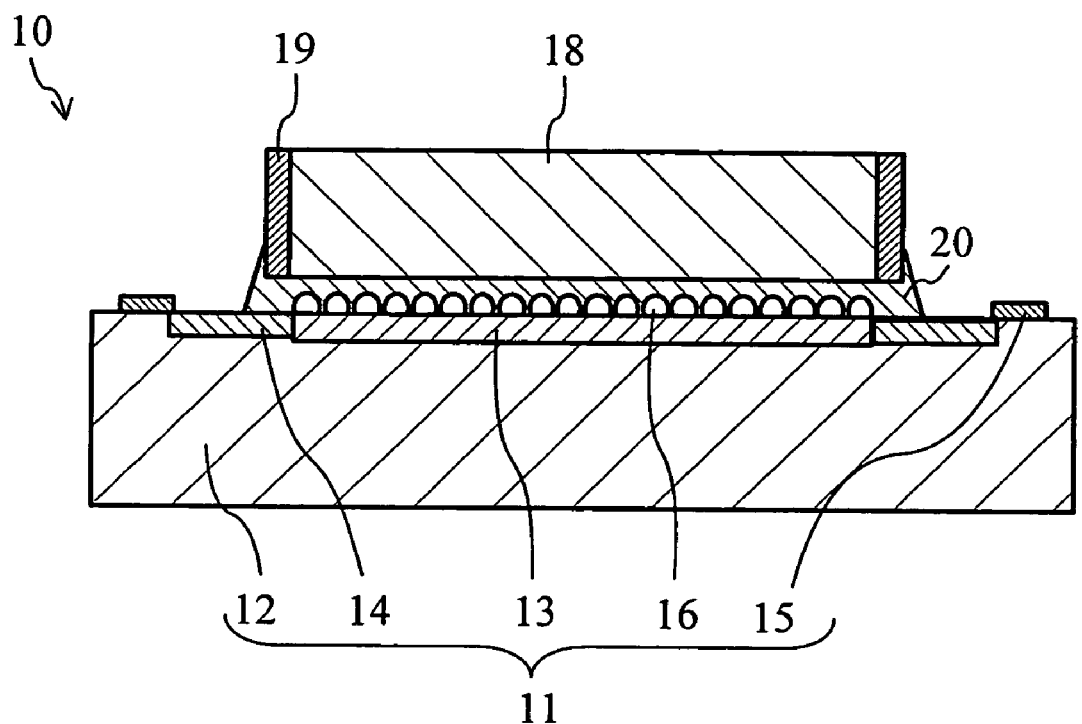
FIG. 1 is a cross-sectional view showing a structure of a semiconductor image sensing element according to a first embodiment of the present invention.

Referring to the drawings, the embodiments of the present invention will be described herein below in detail. For drawing convenience, components in the drawings are different in thickness, length, configuration, and the like from the actual components. The number of electrodes on a semiconductor image sensing element is also different from that in an actual situation. The number of the electrodes in the drawings is such that it allows easy depiction of the electrodes. There are cases where the description of the same components is omitted by retaining the same reference numerals. There are also cases where small components and the like are not hatched in cross-sectional views for clarity of illustration.

Embodiment 1

FIG. 1 is a cross-sectional view showing a structure of a semiconductor image sensing element 10 according to the first embodiment of the present invention. The semiconductor image sensing element 10 according to the present embodiment comprises: a semiconductor element 11 including an image sensing area 13, a peripheral circuit region 14, a plurality of electrode portions 15 provided in the peripheral circuit region 14, and a plurality of micro-lenses 16 provided on the image sensing area 13; and an optical member having a configuration covering at least the image sensing area 13 and bonded over the micro-lenses 16 via a transparent bonding member 20. The side surface region of the optical member 18 is formed with a light shielding film 19 serving as a light shielding portion for preventing the irradiation of the image sensing area 13 with a reflected light beam or a scattered light beam from the side surface region.

A more specific structure will be described herein below. In the semiconductor element 11, the image sensing area 13 is formed in a semiconductor substrate 12 made of silicon, germanium, a group III-V compound, or the like and the peripheral circuit region 14 is formed around the outer periphery of the image sensing area 13. In the peripheral circuit region 14, the electrode portions 15 are provided. On the surface of the image sensing area 13, the micro-lenses 16 made of a transparent acrylic resin or the like are formed.

Over the upper surfaces of the micro-lenses 16, the optical member 18 is bonded via the transparent bonding member 20. On the side surface region of the optical member 18, the light shielding film 19 having a light shielding property is formed by using a meal or a resin. The optical member 18 having the light shielding film 19 formed only on the side surface region thereof can be produced by, e.g., forming a resist film on each of the both surfaces of the optical member 18, forming a metal film by vapor deposition or the like, and then removing the resist film.

The optical member 18 can be produced by forming a material such as, e.g., Terex glass, Pyrex glass, quartz, an acrylic resin, a polyimide resin, or an epoxy resin into a sheet-like configuration. For the transparent bonding member 20, a UV setting or thermosetting material having a refractivity lower than that of the material of the micro-lenses 16, such as an acrylic resin, a polyimide resin, or an epoxy resin, can be used.

By forming such a structure, the side surface region of the optical member 18 is covered with the light shielding film 19 having a light shielding property. As a result, even when the semiconductor image sensing element 10 is mounted on a mounting substrate, a reflected light beam or a scattered light beam from metal thin wires or the like can be prevented from being incident on the image sensing area 13. In addition, even when the side surface region of the optical member 18 is irradiated with the light incident on the main surface of the optical member 18, the reflected light beam therefrom can be prevented from being incident again on the image sensing area 13. This allows the prevention of the disturbed light beam from being incident on pixels in the image sensing area 13 and thereby allows the prevention of the occurrence of flare, smear, or the like in image signals.

Since the optical member 18 is bonded directly over the micro-lenses 16 formed on the image sensing area 13 of the semiconductor element 11 via the transparent bonding member 20, the thin and compact semiconductor image sensing element 10 can be obtained.

A description will be given herein below to a method for fabricating the semiconductor image sensing element 10 according to the present embodiment.

Figure 2A:
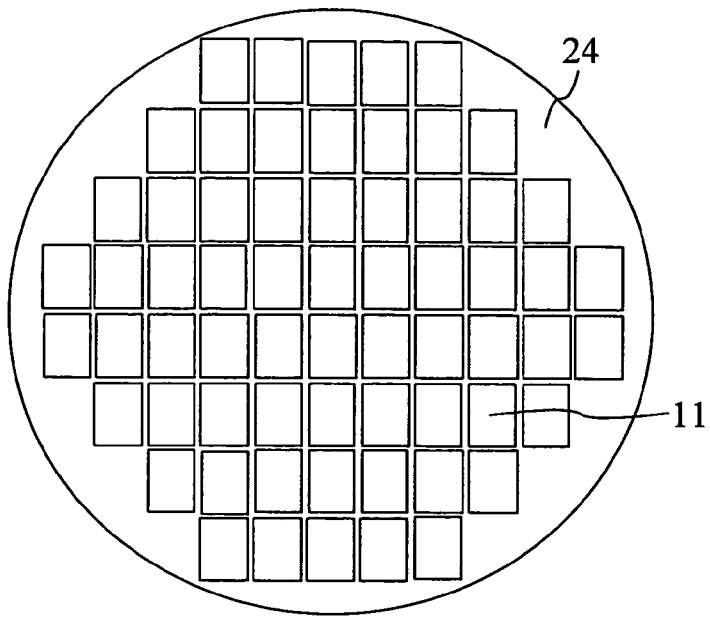
FIG. 2A is a plan view showing semiconductor elements according to the first embodiment that have been formed on a semiconductor wafer.
Figure 2B:
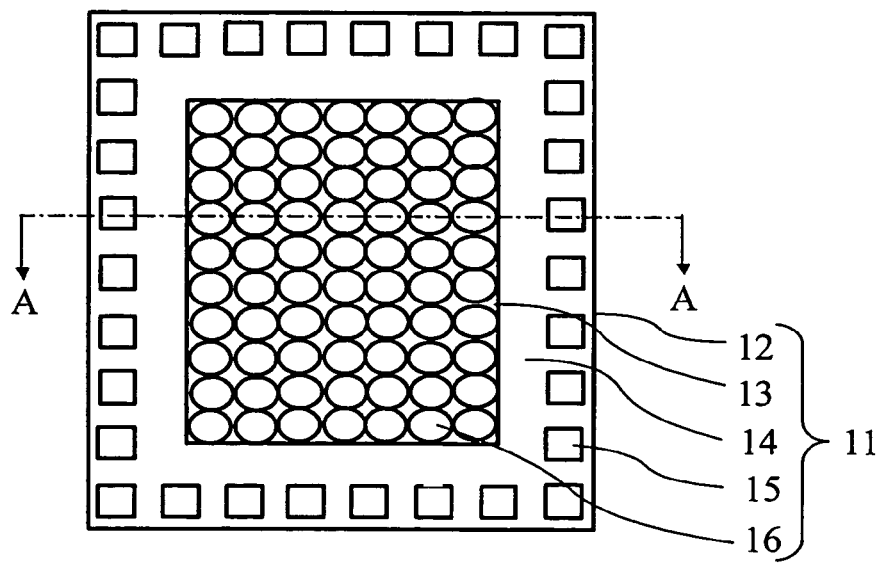
FIG. 2B is a plan view of each of the separate individual semiconductor elements.
Figure 2C:
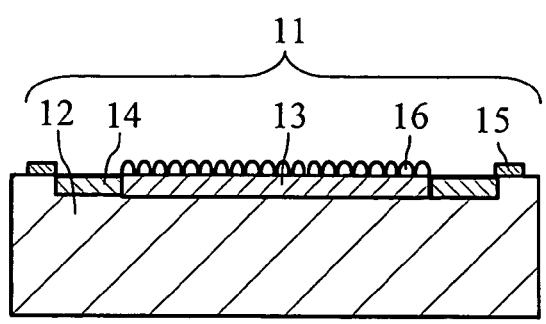
FIG. 2C is a cross-sectional view along the line A-A of FIG. 2B.

FIGS. 2A to 2C are views illustrating the semiconductor elements 11 according to the present embodiment that have been formed on a semiconductor wafer 24 and showing the configuration of each of the separate individual semiconductor elements 11, of which FIG. 2A is a plan view showing the semiconductor elements 11 that have been formed on the semiconductor wafer 24, FIG. 2B is a plan view of each of the separate individual semiconductor elements 11, and FIG. 2C is a cross-sectional view along the line A-A of FIG. 2B.

As shown in FIG. 2A, the semiconductor elements 11 are formed with a given arrangement pitch on the principal surface of the semiconductor wafer 24 in such a manner that they are separated by individual dicing lanes (not shown) for finally dividing the semiconductor wafer 24 into the individual semiconductor image sensing elements 10. As shown in FIGS. 2B and 2C, each of the semiconductor elements 11 is comprised of the image sensing area 13 located at the center portion thereof, the peripheral circuit region 14 provided around the image sensing area 13, the electrode portions 15 provided in the peripheral circuit region 14, and the micro-lenses 16 provided as an array on the upper surface of the image sensing area 13. The image sensing area 13 is comprised of a plurality of pixels made of photodiodes and the micro-lenses 16 are formed over the individual pixels on a one-by-one basis. The electrode portions 15 are for connecting each of the semiconductor image sensing elements 10 to external equipment after the completion thereof and connection is provided by using metal thin wires or bumps.

Referring to FIGS. 3A to 3D, a description will be given to the process steps of bonding the optical members 18 by using the semiconductor wafer 24 thus formed with the semiconductor elements 11 and finally processing the semiconductor wafer 24 into the individual semiconductor image sensing elements 10. FIGS. 3A to 3D are cross-sectional views for illustrating the main process steps after the optical members 18 are bonded over the respective image sensing areas 13 of the individual semiconductor elements 11 on the semiconductor wafer 24 till the semiconductor wafer 24 is processed into the separate individual semiconductor image sensing elements 10. The optical members 18 are bonded over the respective image sensing areas 13 of the individual semiconductor elements 11 in the state of the semiconductor wafer 24 and the semiconductor elements 11 that have been determined to be acceptable in an image test and an electric property test are bonded.

Figure 3A:
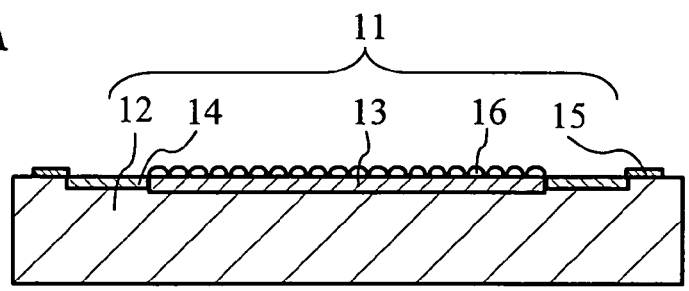
FIGS. 3A to 3D are cross-sectional views for illustrating the main process steps after optical members are bonded to the individual semiconductor elements on the semiconductor wafer till the semiconductor wafer is processed into the separate individual semiconductor image sensing elements in a method for fabricating the semiconductor image sensing element according to the first embodiment.
Figure 3B:
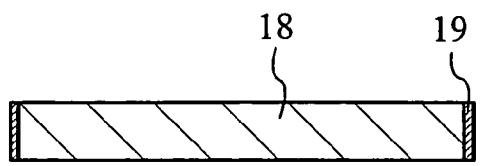

First, as shown in FIG. 3A, the semiconductor wafer 24 having a principal surface on which the semiconductor elements 11 before the optical members 18 are bonded thereto are formed with a given arrangement pitch is prepared. Although FIG. 3A illustrates the bonding step by using one of the semiconductor elements 11, the operation is actually performed with respect to the plurality of semiconductor elements 11 formed on the semiconductor wafer. The thickness of the semiconductor wafer 24 is preferably in the range of 150 µm to 1000 µm, more preferably in the range of about 300 µm to 500 µm. At the same time, the optical member 18 having the light shielding film 19 preliminarily formed on the side surface region thereof by using a metal or resin having a light shielding property and a configuration covering at least the image sensing area 13 is prepared, as shown in FIG. 3B. The thickness of the optical member 18 is preferably in the range of 150 µm to 500 µm, more preferably in the range of about 200 µm to 400 µm.

Figure 3C:
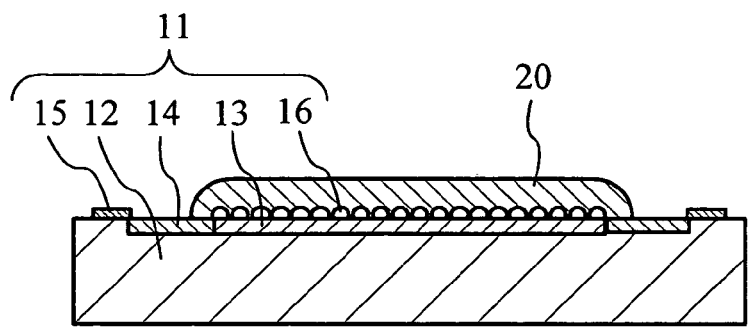

Next, as shown in FIG. 3C, the transparent bonding member 20 of UV setting type is coated to cover the micro-lenses 16 on the image sensing area 13 of each of the semiconductor elements 11 and also partly cover the periphery thereof. The transparent bonding member 20 can be coated by a drawing method, a printing method, a stamping method, or the like.

Figure 3D:
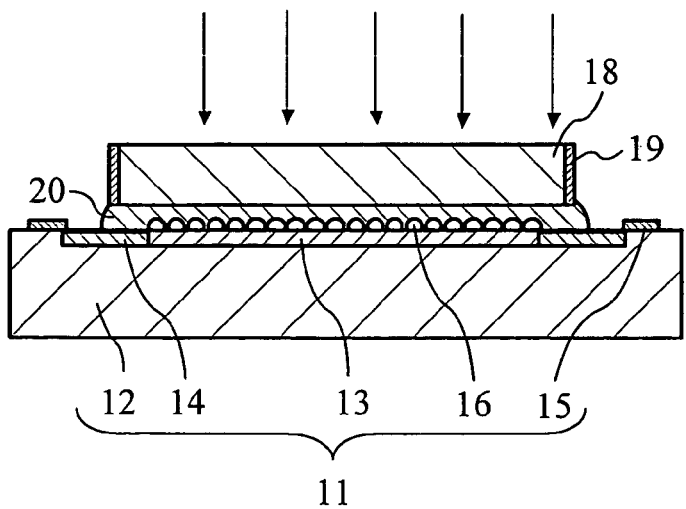

Next, as shown in FIG. 3D, the optical member 18 is aligned to overlie the image sensing area 13 over which the transparent bonding member 20 has been coated. Thereafter, the upper surface of the optical member 18 is pressed from thereover, while the parallelism of the upper surface of the optical member 18 to the surface with the image sensing area 13 is maintained. Then, a UV light beam at a wavelength which cures the transparent bonding member 20 is emitted toward the optical member 18 for irradiation, as indicated by the arrows. As a result, the optical member 18 is bonded to the image sensing area 13 via the transparent bonding member 20 and the semiconductor image sensing element 10 having the optical member 18 bonded over the semiconductor element 11 is obtained.

Finally, the semiconductor wafer 24 is diced along the dicing lanes between the semiconductor sensing elements 10 so that the separate individual semiconductor image sensing elements 10 shown in FIG. 1 are obtainable.

Such a method allows easy fabrication of the semiconductor image sensing element 10 in which optical noise can be prevented by merely bonding the optical member 18 having the light shielding film 19 formed on the side surface region thereof. Since the method also allows the semiconductor image sensing elements 10 to be processed in the state of the semiconductor wafer 24, the micro-lenses 16 on the image sensing areas 13 are prevented from being damaged during the processing and the lowering of an yield due to dust particles and the like can also be suppressed. It is also possible to preliminarily cover the surface of each of the optical members 18 with a resin coating or the like, perform the processing with respect thereto, and then removing the resin coating after mounting. The arrangement prevents the surface of the optical member 18 from being damaged and allows reliable removal of dust or the like even when it adheres to the surface of the optical member 18.

Figure 4A:
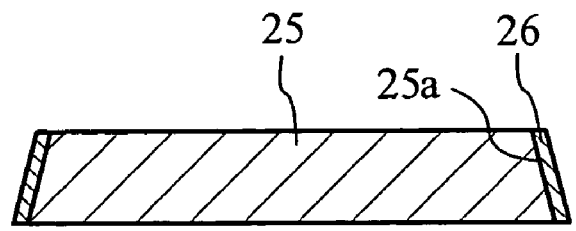
FIG. 4A is a cross-sectional view of a first variation of the optical member used for the semiconductor image sensing element according to the first embodiment.
Figure 4B:
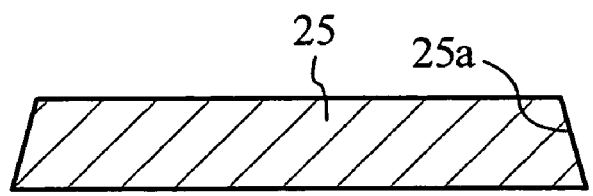
FIG. 4B is a cross-sectional view of a second variation of the optical member.
Figure 4C:
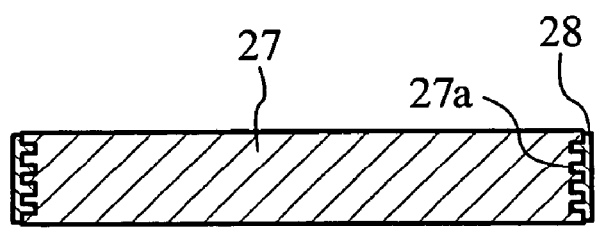
FIG. 4C is a cross-sectional view of a third variation of the optical member.
Figure 4D:
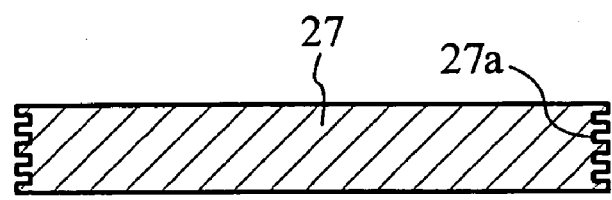
FIG. 4D is a cross-sectional view of a fourth variation of the optical member.

FIGS. 4A to 4D are views illustrating the variations of the optical member used for the semiconductor image sensing element 10 according to the present embodiment, of which FIG. 4A is a cross-sectional view of the first variation of the optical member, FIG. 4B is a cross-sectional view of the second variation of the optical member, FIG. 4C is a cross-sectional view of the third variation of the optical member, and FIG. 4D is a cross-sectional view of the fourth variation of the optical member.

In an optical member 25 according to the first variation of FIG. 4A, the side surface region 25a thereof is configured to tilt with respect to a light receiving surface and a light shielding film 26 is formed on the tilted side surface region 25a.

In the optical member 25 according to the second variation of FIG. 4B, the side surface region 25a thereof is configured to tilt with respect to the light receiving surface but the light shielding film 26 of FIG. 4A is not provided thereon. Such a tilted configuration of the side surface region constitutes a light shielding pattern.

In an optical member 27 according to the third variation of FIG. 4C, the side surface region 27a thereof is formed into a rough surface and a light shielding film 28 is further formed on the side surface region 27a formed into the rough surface.

In the optical member 27 according to the fourth variation of FIG. 4D, the side surface region 27a thereof is formed into a rough surface but the light shielding film 28 of FIG. 4C is not provided thereon. Such a rough surface configuration of the side surface region constitutes a light shielding pattern.

In the arrangement, the incidence of a reflected light beam or a scattered light beam from metal thin wires, bumps, a package, or the like on the image sensing area from the side surface region of the optical member can be more reliably prevented. As a result, a semiconductor image sensing element having more excellent properties can be obtained.

Figure 5:
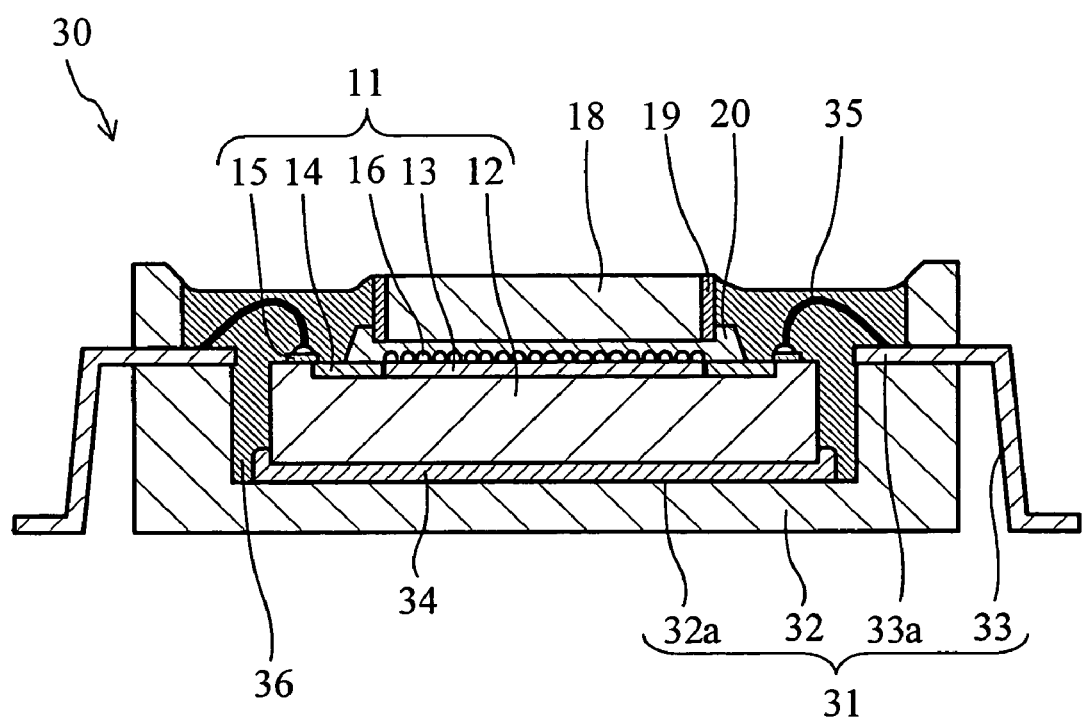
FIG. 5 is a cross-sectional view showing a structure of a semiconductor image sensing device constructed by using the semiconductor image sensing element according to the first embodiment.

FIG. 5 is a cross-sectional view showing a structure of a semiconductor image sensing device 30 constructed by using the semiconductor image sensing element 10 according to the present embodiment. The semiconductor image sensing device 30 according to the present embodiment comprises: the semiconductor image sensing element 10; a package 31 having a mounting portion 32a to which the semiconductor image sensing element 10 is fixed and metal thin wire connection portions 33a; a fastening member 34 for fastening the semiconductor image sensing element 10 to the mounting portion 32a of the package 31; metal thin wires 35 for providing connection between the electrode portions 15 of the semiconductor image sensing element 10 and the metal thin wire connection portions 33a; and a burying resin 36 for burying the metal thin wires 35 therein and protecting them.

The package substrate 32 of the package 31 is formed with a cavity into which the semiconductor image sensing element 10 is fastened by using the fastening member 34. The package substrate 32 is also provided with terminal pins 33 connected to or integrally formed with the metal thin wire connection portions 33a. The inner surface of the cavity has been processed into a pear-shaped configuration for preventing reflection. The semiconductor image sensing element 10 is bonded to the mounting portion 32a of the cavity by using the fastening member 34 made of an epoxy resin, a polyimide resin, or the like. The metal thin wires 35 such as gold wires, copper wires, aluminum wires, or the like provide connection between the plurality of electrode portions 15 arranged on the peripheral circuit region 14 of the principal surface of the semiconductor image sensing element 10 and the metal thin wire connection portions 33a of the package 31.

In the cavity of the package 31 accommodating the semiconductor image sensing element 10 therein, the light-shielding burying resin 36 made of an epoxy resin or a polyimide resin is filled to a height which allows the metal wires 35 to be buried in the burying resin 36. Thus, the semiconductor image sensing device 30 is obtained.

Although the present embodiment has formed the semiconductor image sensing device 30 by using the package 31 with leads, the present invention is not limited thereto. For example, it is also possible to die-bond the semiconductor image sensing element onto a mounting substrate, provide connection by using metal thin wires, and then fill the burying resin such that the metal thin wires are buried therein. Alternatively, a leadless package may also be used instead.

In the arrangement, the light shielding film 19 is formed on the side surface region of the optical member 18 and the metal thin wires 35 are covered with the light-shielding burying resin 36. This allows reliable prevention of the incidence of a reflected light beam or a scattered light beam from the metal thin wires 35 on the image sensing area 13 and the occurrence of flare, smear, or the like. This also allows the generally thin and compact semiconductor image sensing device 30 to be implemented.

A description will be given herein below to a method for fabricating the semiconductor image sensing device 30 according to the present embodiment with reference to FIGS. 6A to 6D. FIGS. 6A to 6D are cross-sectional views illustrating the main process steps for fabricating the semiconductor image sensing device 30 according to the present embodiment.

Figure 6A:
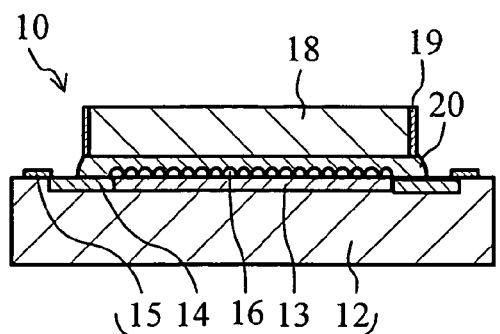
FIGS. 6A to 6D are cross-sectional views illustrating the main process steps for fabricating the semiconductor image sensing device according to the first embodiment.

First, as shown in FIG. 6A, the semiconductor image sensing element 10 having a structure in which the optical member 18 is bonded over the surface of the image sensing area 13 which is formed with the micro-lenses 16 is prepared. The light shielding film 19 has been formed on the side surface region of the optical member 18.

Figure 6B:
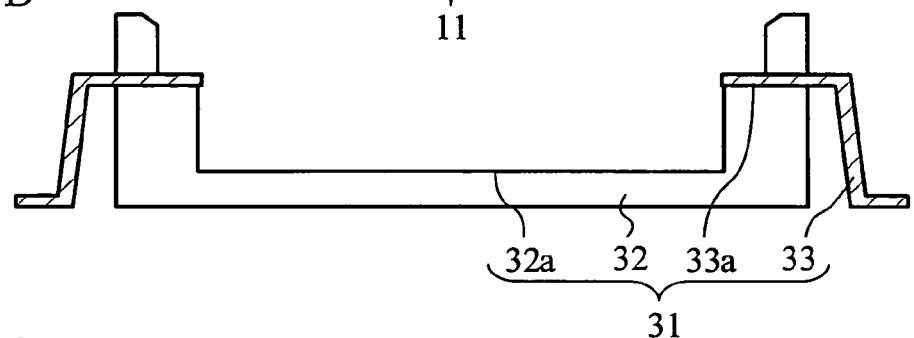

Next, as shown in FIG. 6B, the package 31 comprised of the package substrate 32 having the cavity and the mounting portion 32a provided on the bottom portion of the cavity and the terminal pins 33 provided on the package substrate 32 is prepared. Preferably, the inner surface of the cavity of the package substrate 32 of the package 31 is formed into a rough surface since it can also prevent the incidence of a reflected light beam on the image sensing area 13 or the like. However, such processing for forming a rough surface is not necessarily needed. At this time, the cavity of the package 31 is designed to have a depth equal to or more than the thickness of the semiconductor image sensing element 10.

Figure 6C:
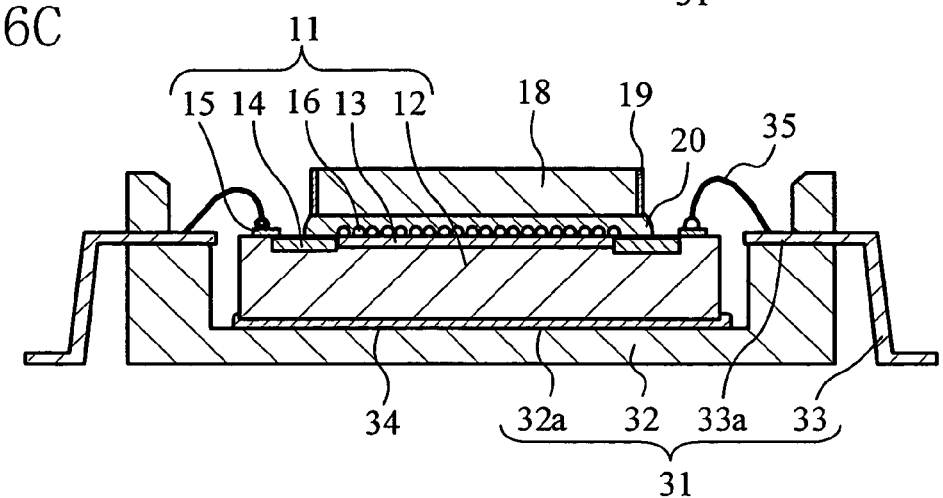

Next, as shown in FIG. 6C, the fixing member 34 is coated on the mounting portion 32a. The fixing member 34 can be coated by, e.g., a multiple-shot dispensing method or a drawing method. Thereafter, the semiconductor image sensing element 10 is placed on the mounting portion 32a and bonded by using the fastening member 34, while the parallelism of the primary surface of the semiconductor image sensing element 10 is maintained. Further, the electrode portions 15 of the semiconductor image sensing element 10 and the metal thin wire connection portions 33a are connected by wire bonding using the metal thin wires 35, whereby the electric connection of the semiconductor image sensing element 10 and the terminal pins 33 of the package 31 is completed.

Figure 6D:
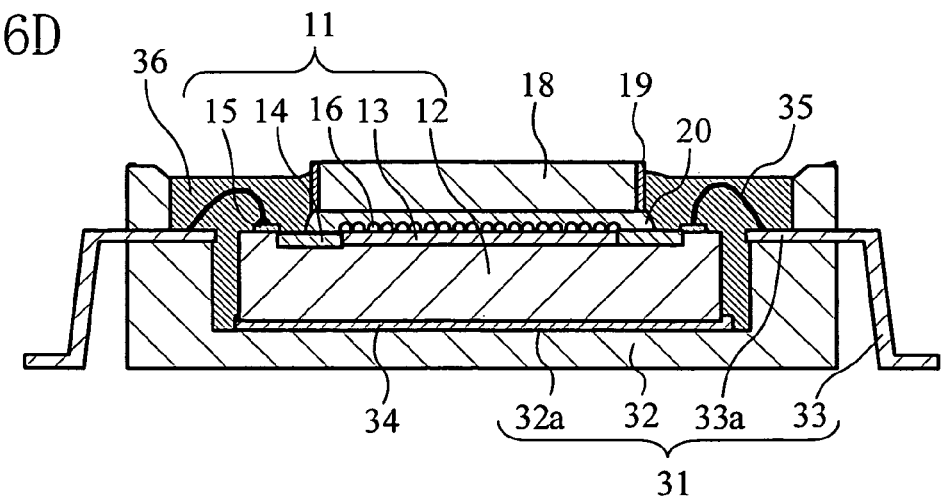

Next, as shown in FIG. 6D, the light-shielding burying resin 36 is filled in the gap between the semiconductor image sensing element 10 mounted in the cavity of the package 31 and the sidewall of the cavity to a height which allows the metal thin wires 35 to be buried in the burying resin 36 by using, e.g., a dispenser or the like. Then, the package 31 is heated to cure the burying resin 36, whereby the semiconductor image sensing device 30 according to the present embodiment is obtainable.

In the semiconductor image sensing device 30 fabricated by such a method, the incidence of a reflected light beam or a scattered light beam from the metal thin wires 35 or the like on the image sensing area can be reliably prevented by the burying resin 36 covering the meta thin wires 35 and by the light shielding film 19 of the optical member 18. As a result, the semiconductor image sensing device 30 in which optical noise such as flare or smear is prevented and which has excellent properties can be fabricated in simple and easy process steps.

The semiconductor image sensing device 30 according to the present embodiment is not limited to the semiconductor element 10 shown in FIG. 1. Instead of the semiconductor element 10, a semiconductor element using the optical member shown in any of FIGS. 4A to 4D may also be used. The burying resin is not limited to a light shielding material. For example, a transparent resin material may also be used instead. In this case, the incidence of a reflected light beam or a scattered light beam on the image sensing area can be prevented by the light shielding film formed on the side surface region of the optical member. In this structure, the exposed portion of the transparent bonding member for bonding the optical member is not shielded from a light beam so that there is the possibility of the incidence of a scattered light beam from the exposed portion on the image sensing area. However, since the thickness of the transparent bonding member is extremely small, there is substantially no influence in most cases.

Embodiment 2

Figure 7:
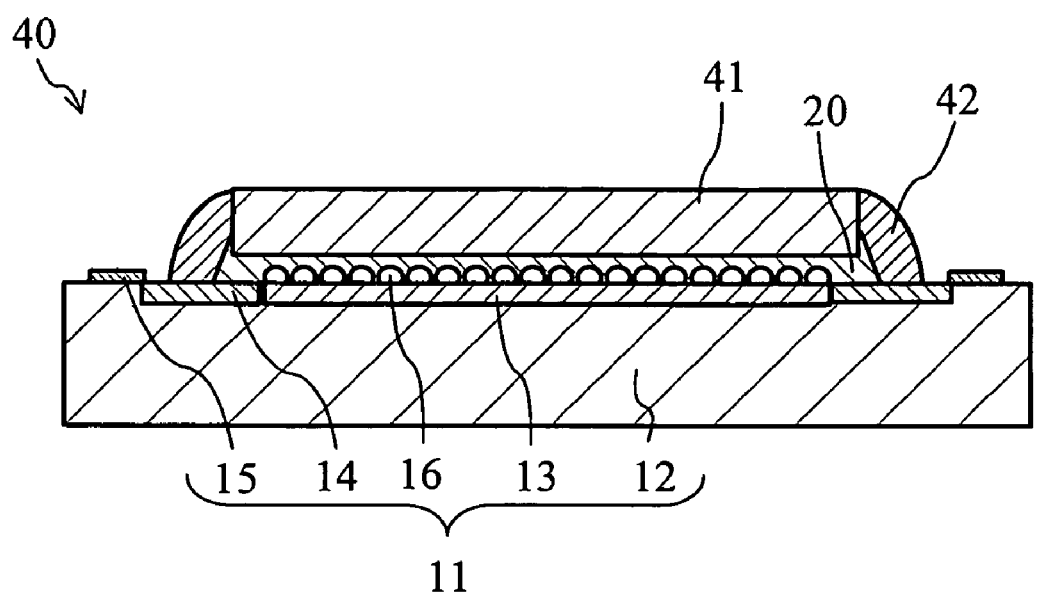
FIG. 7 is a cross-sectional view showing a structure of a semiconductor image sensing element according to a second embodiment of the present invention.
Figure 8A:
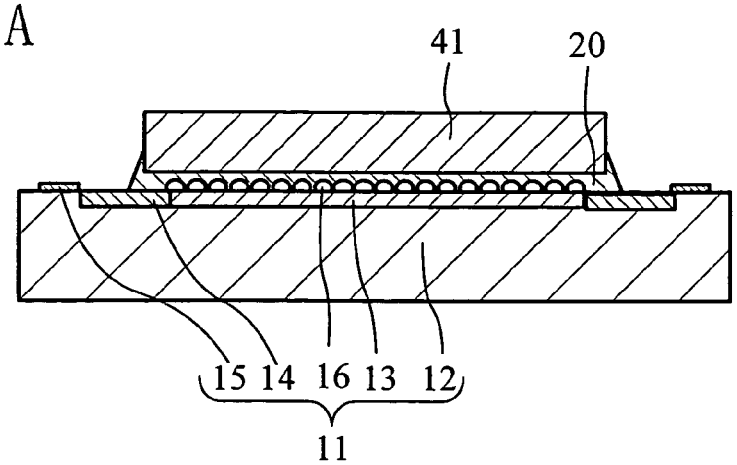
FIG. 8A to 8C are cross-sectional views illustrating the main process steps of a method for fabricating the semiconductor image sensing element according to the second embodiment.
Figure 8B:
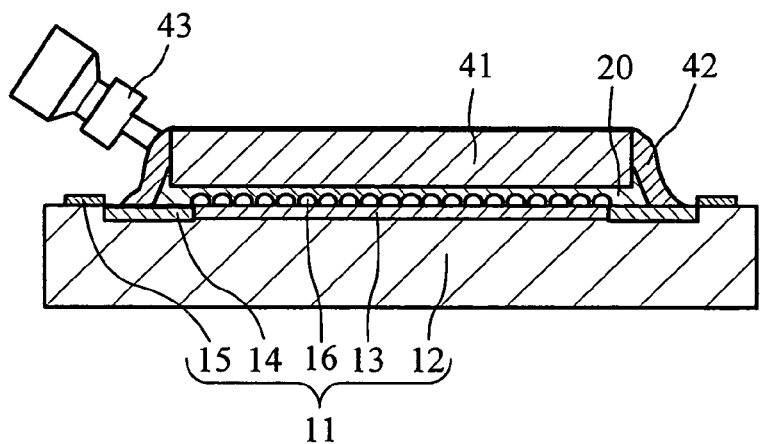
Figure 8C:
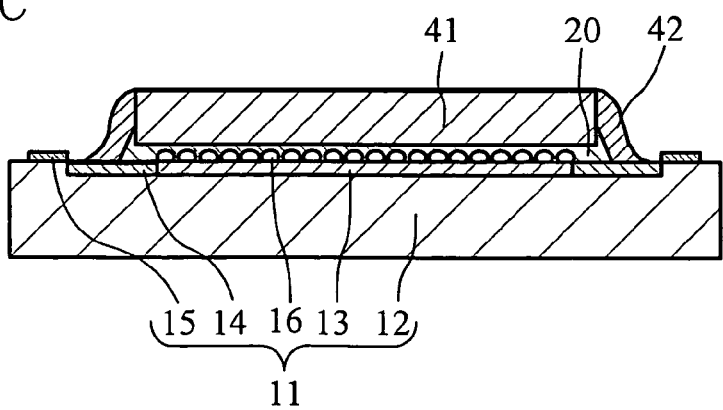
Figure 9:
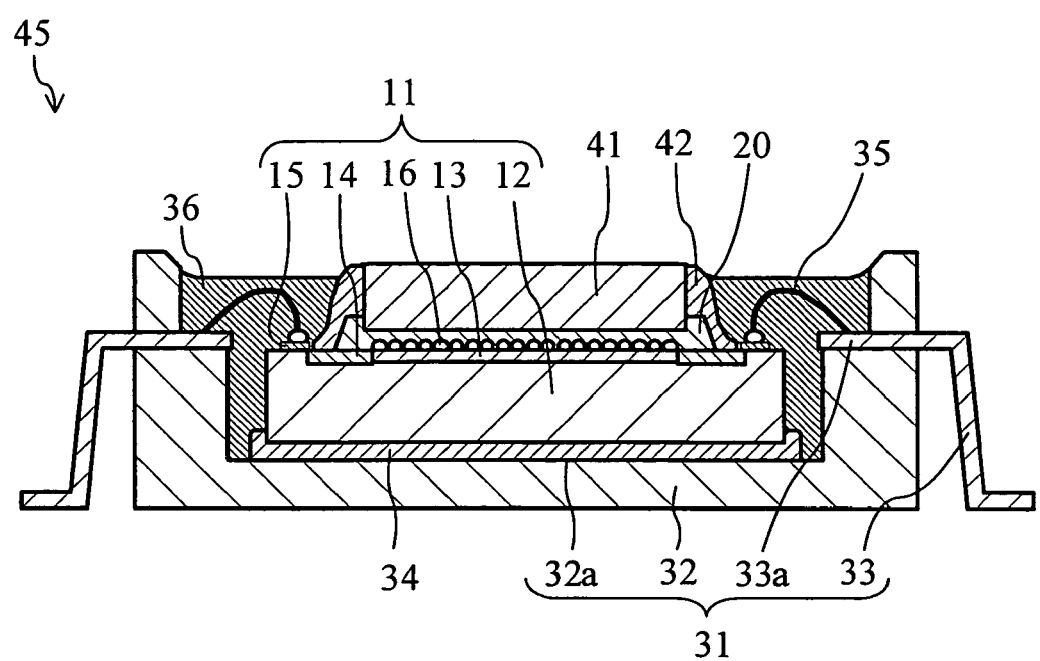
FIG. 9 is a cross-sectional view showing a structure of a semiconductor image sensing device constructed by using the semiconductor image sensing element according to the second embodiment.

FIG. 7 is a cross-sectional view showing a structure of a semiconductor image sensing element 40 according to the second embodiment of the present invention. FIGS. 8A to 8C are cross-sectional views illustrating the main process steps of a method for fabricating the semiconductor image sensing element 40. FIG. 9 is a cross-sectional view showing a structure of a semiconductor image sensing device 45 constructed by using the semiconductor image sensing element 40. Referring to these drawings, the semiconductor image sensing element 40 and the semiconductor image sensing device 45 according to the present embodiment and fabrication methods therefor will be described herein below.

In the same manner as in the first embodiment, an optical member 41 is bonded over the plurality of semiconductor elements 11 formed on the semiconductor wafer and then a light shielding member 42 is further formed. Since the semiconductor element 11 is the same as in the first embodiment, the description thereof will be omitted.

As shown in FIG. 7, the optical member 41 according to the present embodiment is bonded over the micro-lenses 16 of the semiconductor element 11. However, the present embodiment has not formed a light shielding film, a light shielding pattern, or the like on the side surface region of the optical member 41. As the material of the optical member 41 and the material of the transparent bonding member 20, the same materials as used in the first embodiment can be used so that the description thereof will be omitted.

On the side surface region of the optical member 41 and on the exposed region of the transparent bonding member 20, the light shielding member 42 has been formed by coating or the like. The light shielding member 42 is made of a resin containing a dye or particle which cuts off at least a visible light beam. The light shielding member 42 is formed by using, e.g., a liquid epoxy resin, acrylic resin, polyimide resin, or the like containing particles of carbon or the like or a black dye, coating the resin on the side surface region of the optical member 41, and then curing it.

After the light shielding member 42 is formed, the semiconductor wafer is cut by dicing in the same manner as in the first embodiment so that the separate individual semiconductor image sensing elements 40 are obtained.

In the arrangement, the side surface region of the optical member 41, the exposed region of the transparent bonding member 20, and a part of the peripheral circuit region 14 of each of the semiconductor elements 11 or the peripheral circuit region 14 except for the electrode portions 15 can be covered with the light shielding member 41. This can prevent the incidence of a reflected light beam or a scattered light beam on the image sensing area 13 from the side surface region of the optical member 41 or from the exposed region of the transparent bonding member 20 and can prevent optical noise such as flare or smear.

FIG. 8A to 8C are cross-sectional views illustrating the main process steps of fabricating the semiconductor image sensing element 40 according to the present embodiment. Although the bonding of the optical member 41, the coating of the light shielding member 42, and the like are performed with respect to the semiconductor elements 11 in the state of a semiconductor wafer, FIGS. 8A to 8C show the fabrication process which is performed over one of the semiconductor elements 11. In the fabrication method according to the present embodiment also, the optical member 41 and the light shielding member 42 can be formed for only the semiconductor elements 11 that have been determined to be acceptable in an image test and an electric property test.

First, as shown in FIG. 8A, the optical member is bonded over the micro-lenses 16 on the image sensing area 13 of the semiconductor element 11 by using the transparent bonding member 20. The thickness of the optical member 41 may also be adjusted to the same as that of the optical member 18 according to the first embodiment.

Next, as shown in FIG. 8B, a liquid resin used to form the light shielding member 42, e.g., an epoxy resin is ejected from a dispenser such that the light shielding member 42 is coated to cover the side surface region of the optical member 41, the exposed region of the transparent bonding member 20, a part of the peripheral circuit region 14 of the semiconductor element 11 or the peripheral circuit region 14 except for the electrode portions 15. Preferably, the light shielding member 42 is coated so as not to seep over to the upper surface of the optical member 41. By forming the optical member 41 into a configuration which extensively covers a part of the peripheral circuit region 14, it is possible to prevent the light shielding member 42 from being coated over the upper surface to a position corresponding to the image sensing area 13 even when the light shielding member 42 has partly seeped over to the upper surface of the optical member 41. Accordingly, the coating step can be simplified.

After the liquid resin used to form the light shielding member 42 is coated, it is heated and cured to form the light shielding member 42. The amount of seeping can be reduced by using a material containing a UV setting resin and coating the material by using a dispenser, while simultaneously irradiating the ejected material with a UV light beam. In this case also, the coated material may be heated and cured appropriately. In this manner, the semiconductor image sensing elements 40 in each of which the optical member 41 is bonded over the semiconductor element 11 and the light shielding member 42 is formed therearound are fabricated on the semiconductor wafer. Then, the semiconductor wafer is cut along the specified dicing lanes such that the separate individual semiconductor image sensing elements 40 are obtained.

Such a fabrication method allows the prevention of optical noise to the pixels of the semiconductor image sensing elements 40 by merely coating and forming the light shielding member 42 on the side surface region of the optical member 41 and allows the semiconductor image sensing elements 40 having excellent properties to be obtained. It is also possible to use the optical member with the tilted surface or the rough surface described in the first embodiment.

FIG. 9 is a cross-sectional view showing a structure of the semiconductor image sensing device 45 constructed by using the semiconductor image sensing element 40 according to the present embodiment. The structure of the semiconductor image sensing device 45 and the fabrication method therefor are the same as the structure and fabrication method described with reference to FIGS. 4A to 4D in the first embodiment so that the description thereof will be omitted.

In the semiconductor image sensing device 45 having such a structure, the incidence of a reflected light beam or a scattered light beam from the metal thin wires 35 on the image sensing area 13 can be prevented and optical noise such as flare or smear can be prevented. The burying resin 36 is not limited to a light shielding material. For example, a transparent resin material may also be used instead. In that case also, the light shielding member 42 formed on the side surface region of the optical member 41 can prevent the incidence of a reflected light beam or a scattered light beam on the image sensing area 13.

Embodiment 3

Figure 10:
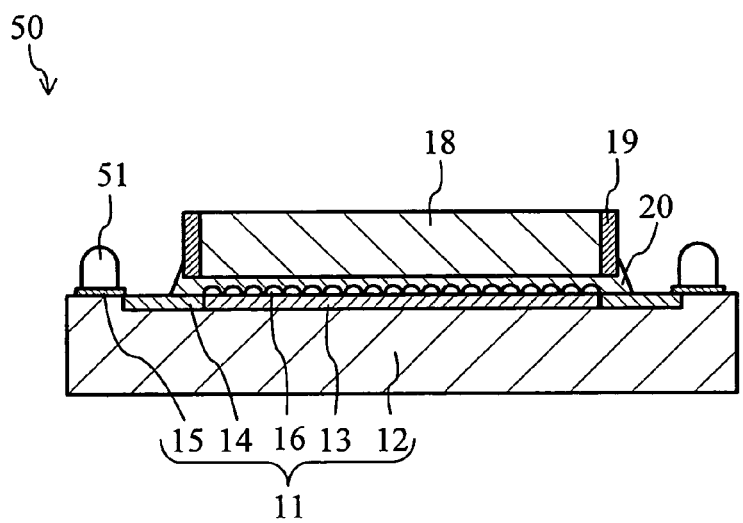
FIG. 10 is a cross-sectional view showing a structure of a semiconductor image sensing element according to a third embodiment of the present invention.
Figure 11:
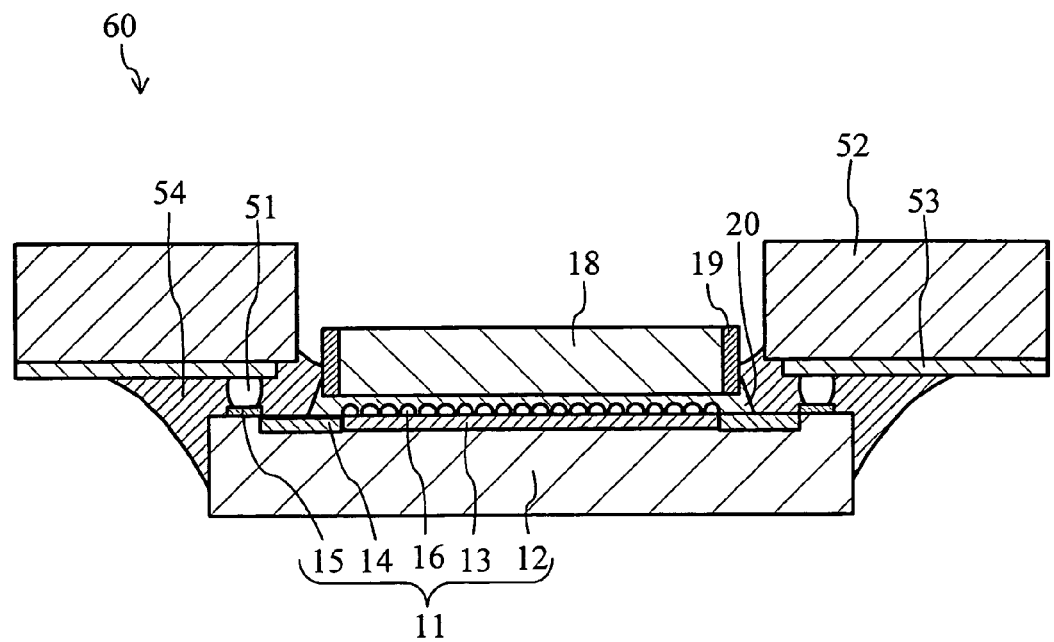
FIG. 11 is a cross-sectional view showing a structure of a semiconductor image sensing device using the semiconductor image sensing element according to the third embodiment.

FIG. 10 is a cross-sectional view showing a structure of a semiconductor image sensing element 50 according to the third embodiment of the present invention. FIG. 11 is a cross-sectional view showing a structure of a semiconductor image sensing device 60 using the semiconductor image sensing element 50.

The semiconductor image sensing element 50 according to the present embodiment is a semiconductor image sensing element with bumps which is constructed by providing bumps 51 on the electrode portions 15 of the semiconductor image sensing element 10 according to the first embodiment.

As the bumps 51, stud bumps using wire leads or bumps made of solder balls can be used by way of example. The formation of the bumps 51 by a stud bump process is performed by using gold wires, copper wires, or the like. Since the formation method is well known, the description thereof will be omitted. Ball bumps made of solder balls can also be formed on the electrode portions 15 by using a well-known technology. Preferably, the bumps 51 are formed after dividing the semiconductor wafer into the separate individual semiconductor image sensing elements 50. However, the bumps 51 may also be formed while the semiconductor image sensing elements 50 are still in the state of the semiconductor wafer.

The semiconductor image sensing element 50 having such a structure can not only prevent optical noise but also suppress electric noise since the bumps 51 provide connection between the electrode portions 15 of the semiconductor image sensing element 50 and the mounting substrate.

A description will be given next to a structure of the semiconductor image sensing device 60 with reference to FIG. 11. The semiconductor image sensing device 60 has the semiconductor image sensing element 50 described above, a mounting substrate 52 having an opening (shown in FIGS. 12A to 12C) wider than at least the image sensing area 13 of the semiconductor image sensing element 50 and having electrode terminals 53 arranged around the opening to be connected to the electrode portions 15 of the semiconductor image sensing element 50 by a face-down mounting method, and a molding resin 54 formed on a mounting region between the mounting substrate 52 and the semiconductor image sensing element 50 connected to the electrode terminals 53 via th bumps 51 provided on the surfaces of the electrode portions 15 of the semiconductor image sensing elements 50 and mounted on the mounting substrate 52 and on the portion of the mounting substrate 52 which is adjacent to the mounting region.

The mounting substrate 52 has a wiring pattern and the electrode terminals 53 connected thereto which are formed on at least one surface of a glass epoxy resin substrate or a substrate using an aramid resin.

Figure 12A:
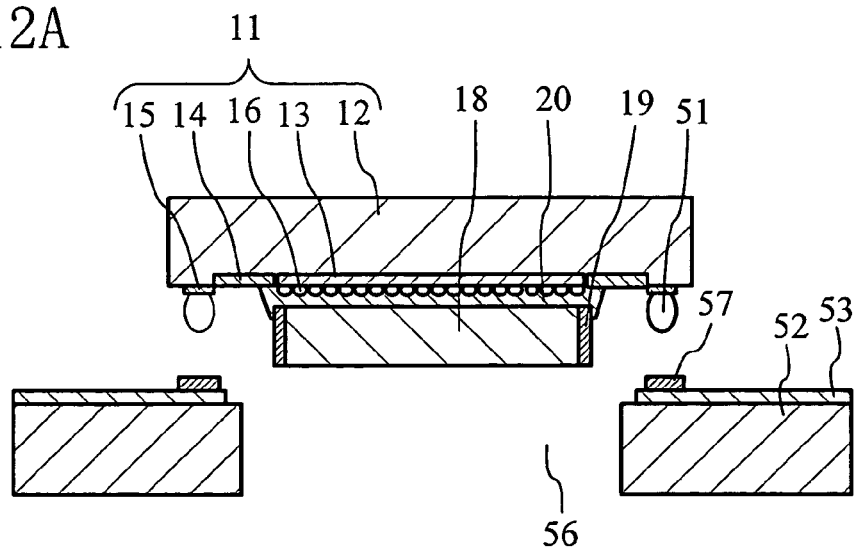
FIGS. 12A to 12C are cross-sectional views illustrating the main process steps for fabricating the semiconductor image sensing device according to the third embodiment.
Figure 12B:
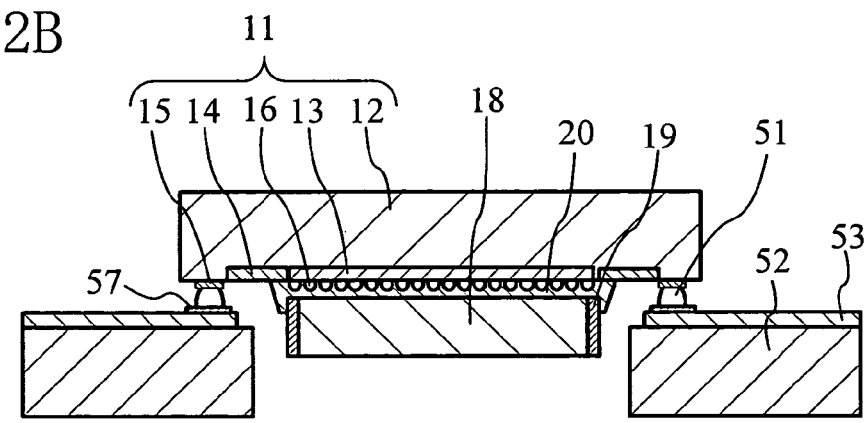
Figure 12C:
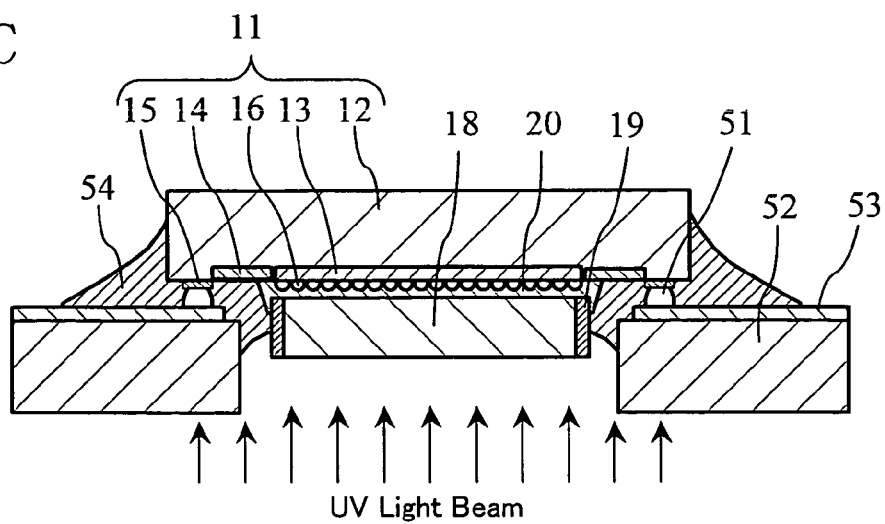

FIGS. 12A to 12C are cross-sectional views illustrating the main process steps of a method for fabricating the semiconductor image sensing device 60.

First, as shown in FIG. 12A, the side of the semiconductor image sensing element 50 formed with the optical member 18 is aligned with respect to the opening 56 of the mounting substrate 52.

Next, as shown in FIG. 12B, the semiconductor image sensing element 50 is pressed in the direction of the mounting substrate 52 so that the electrode portions 15 and the electrode terminals 53 are connected via the bumps 51 by a flip-chip method. In this case, when the bumps 51 are solder bumps, connection can be provided by thermally melting the bumps 51. When the bumps 51 are stud bumps using gold wires, a method which provides connection by using ultrasonic bonding, thermal compression, a conductive adhesive agent, or the like can be used. In the method shown in FIG. 12, a solder paste 57 is coated on the electrode terminals 53 by using a printing method so that connection is provided by soldering.

Next, as shown in FIG. 12C, a light-shielding liquid resin such as a liquid filler made of, e.g., an epoxy resin is injected and filled in the clearance between the principal surface of the semiconductor image sensing element 50 and the surface of the mounting substrate 52 which is formed with the electrode terminals to cover the sidewall portions of the opening 56, the exposed region of the transparent bonding member 20, and the side surface region of the optical member 18. When the liquid filler is cured, it forms the molding resin 54. In this case, a photosensitive liquid filler is injected from the side of the mounting substrate 52 which is provided with the electrode terminals 53, while it is simultaneously irradiated with a UV light beam from the side provided with the optical member 18. As a result, the liquid filler is injected into the mounting region connected to the bumps 51 by the solder paste 57, further flows toward the optical member 18, and is cured by irradiation with the UV light beam. As a result, the seeping of the liquid filler over to the upper surface of the optical member 18 can be reliably prevented. Thereafter, the entire liquid filler is naturally or thermally cured to form the molding resin 54.

Since the light shielding film 19 is formed on the side surface region of the optical member 18 in the semiconductor image sensing element 50 according to the present embodiment, the light-shielding liquid filler need not necessarily be used. A transparent liquid filler may also be used instead. In this case, the liquid filler can be entirely cured by irradiation with a UV light beam so that it is unnecessary to perform a thermosetting process.

The arrangement can prevent a reflected light beam or a scattered light beam from being incident on the image sensing area 13 from the side surface region of the optical member 18 and causing flare, spear, or the like and thereby prevent optical noise. Since the semiconductor image sensing element 50 and the mounting substrate 52 are connected by a face-down mounting method, the thinner and more compact semiconductor image sensing device 60 can be implemented.

Figure 13:
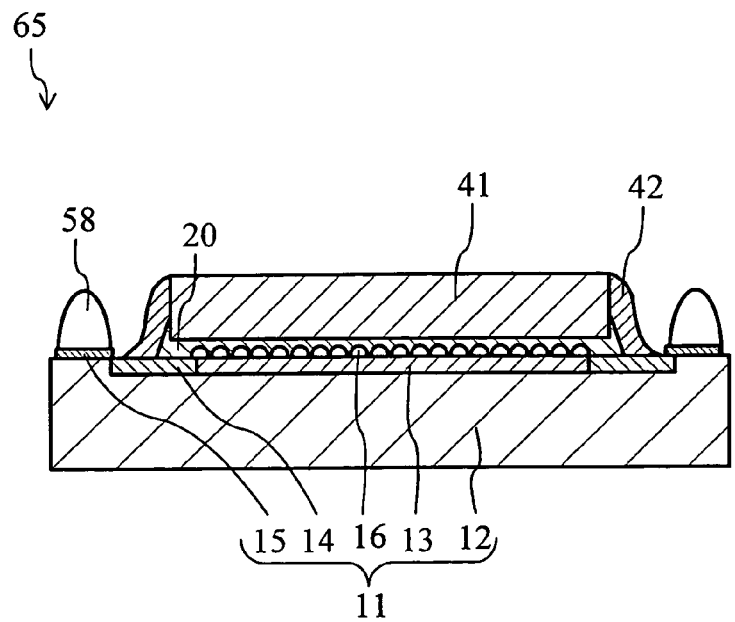
FIG. 13 is a cross-sectional view showing a structure of a semiconductor image sensing element according to a variation of the third embodiment.
Figure 14:
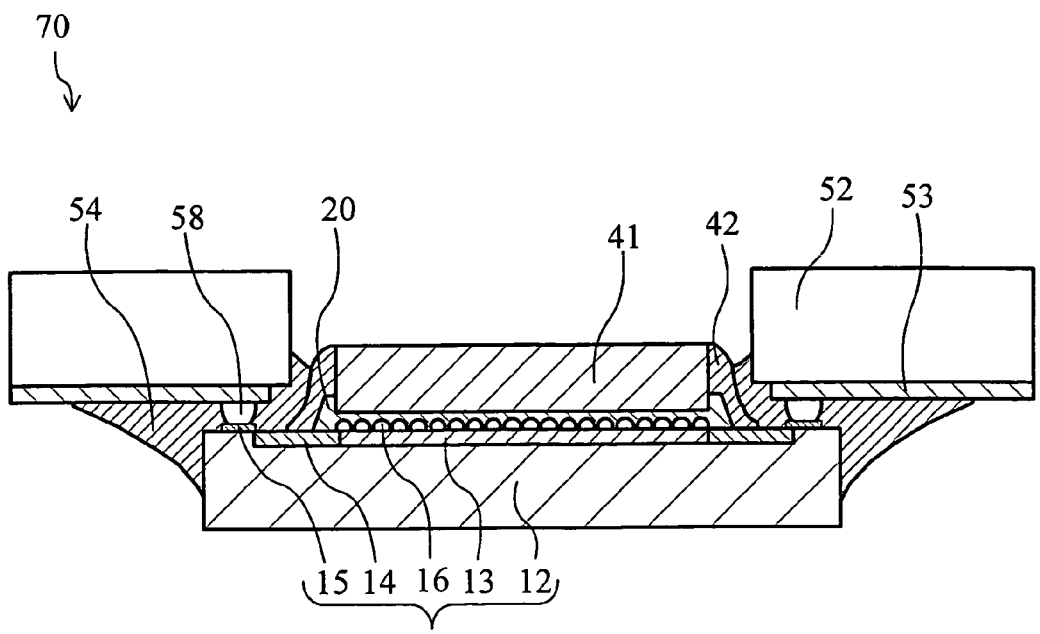
FIG. 14 is a cross-sectional view showing a structure of a semiconductor image sensing device using the semiconductor image sensing element of FIG. 13.

FIG. 13 is a cross-sectional view showing a structure of a semiconductor image sensing element 65 according to a variation of the present embodiment. FIG. 14 is a cross-sectional view showing a structure of a semiconductor image sensing device 70 using the semiconductor image sensing element 65.

The semiconductor image sensing element 65 according to the variation is a semiconductor image sensing element with bumps which is constructed by providing bumps 58 on the electrode portions 15 of the semiconductor image sensing element 40 according to the second embodiment. The description of the bumps 58 will be omitted since they can be fabricated in accordance with the same method as used to fabricate the semiconductor image sensing element 50. The process steps of forming the semiconductor image sensing elements 65 in the state of a semiconductor wafer and then cutting the semiconductor wafer into the separate individual semiconductor image sensing elements 65 can also be performed in the same manner. The description of the structure of the semiconductor image sensing device 70 shown in FIG. 14 and a fabrication process therefor will also be omitted since they can be the same as those of the semiconductor image sensing device 60.

In the semiconductor image sensing element 65 having such a structure and the semiconductor image sensing device 70 using the same, optical noise can be prevented and electric noise can also be suppressed since the bumps 58 provide connection between the electrode portions 15 of the semiconductor image sensing element 65 and the electrode terminals 53 of the mounting substrate 52.

The side surface region of the optical member composing the semiconductor image sensing element can also be formed into various configurations shown in FIG. 4A to 4D. By forming the side surface region of the optical member into such configurations, the influence of a reflected light beam or a scattered light beam can be more reliably prevented.

Figure 15A:
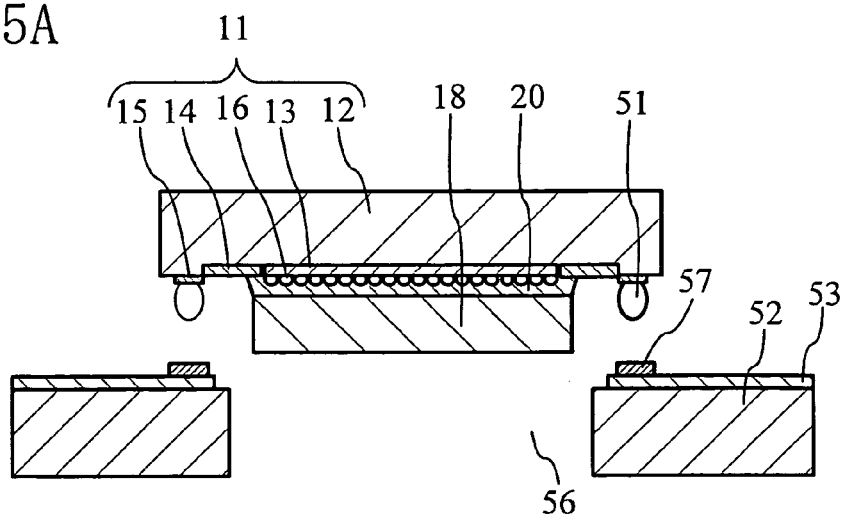
FIGS. 15A to 15C are cross-sectional views illustrating the process steps of fabricating the semiconductor image sensing device using the semiconductor image sensing element according to the third embodiment.
Figure 15B:
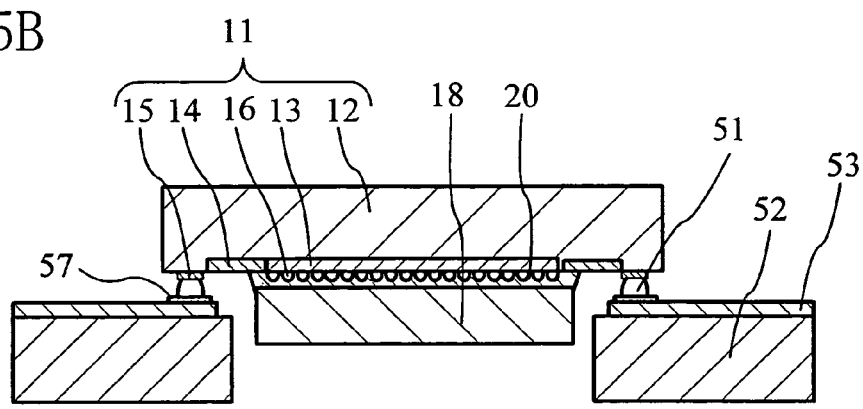
Figure 15C:
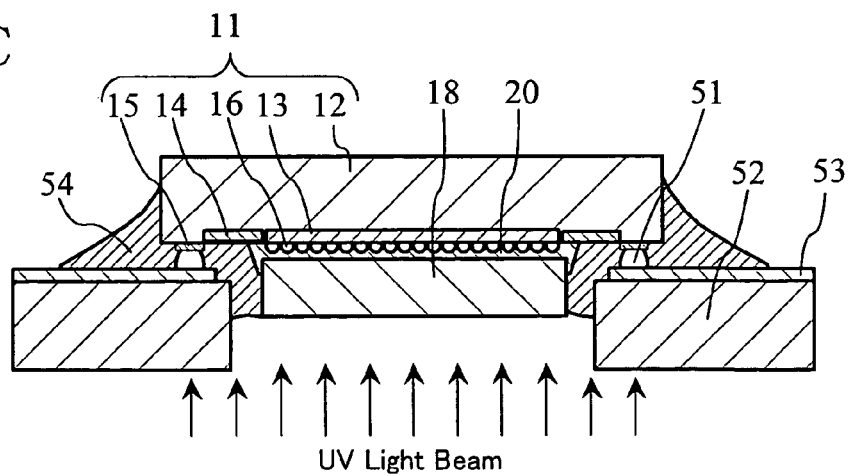

As shown in FIGS. 15A to 15C, the fabrication method according to the present embodiment can also be implemented as follows. Specifically, the semiconductor image sensing element and the mounting substrate having the opening wider than at least the image sensing area of the semiconductor image sensing element and having the electrode terminals arranged around the opening to be connected to the electrode portions of the semiconductor image sensing element by a face-down mounting method are connected by bringing bumps provided on the surfaces of the electrode portions of the semiconductor image sensing element into contact with the electrode terminals.

Next, the molding resin is formed on the mounting region between the semiconductor image sensing element and the mounting substrate and on the portion of the mounting substrate which is adjacent to the mounting region.

At this time, a semiconductor image sensing element which comprises: a semiconductor element including an image sensing area, a peripheral circuit region, a plurality of electrode portions provided in the peripheral circuit region, and a plurality of micro-lenses provided on the image sensing area; and an optical member having a configuration covering at least the image sensing area and bonded over the micro-lenses via a transparent bonding member is used.

As the molding resin, a material which covers the bumps and the electrode terminals, cuts of at least a visible light beam, and is cured with the application of a UV light beam or heat is used. In the case of using a UV setting material, in particular, the resin covering the side surface region of the optical member can be controlled not to seep over to the upper surface of the optical member.

Such a fabrication method can prevent the incidence of a reflected light beam or a scattered light beam from bumps or the like on the image sensing area without preliminarily forming the optical member with a light shielding film, a light shielding pattern, or the like.

Figures 16A, 16B:
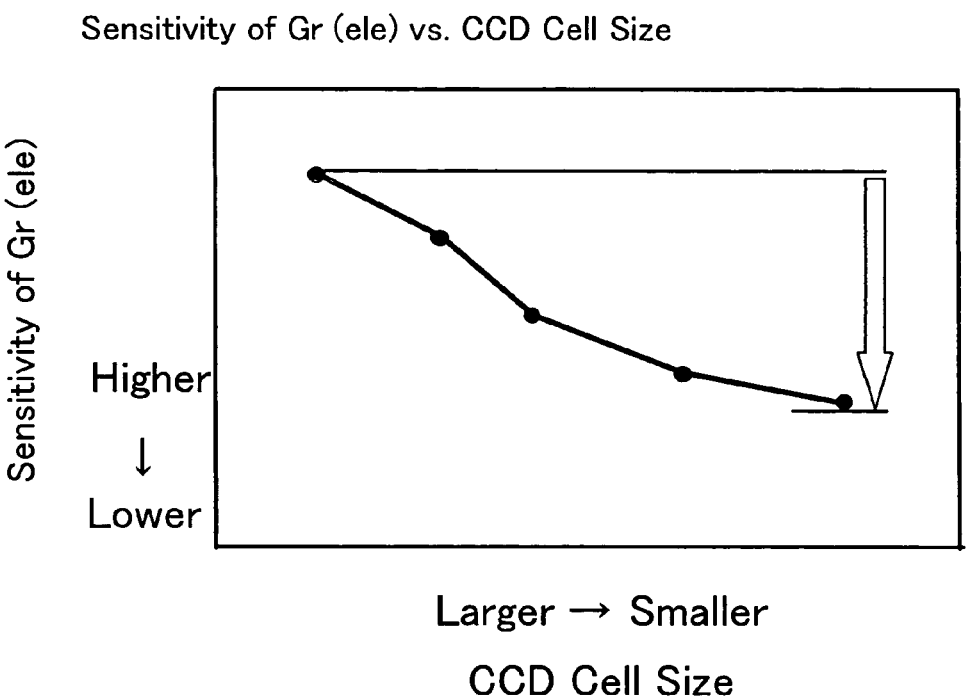
FIG. 16A is a graph showing the degradation of sensitivity resulting from the size reduction of a typical CCD cell and FIG. 16B is a table showing for comparison the effects of a hollow package having a conventional structure and a semiconductor image sensing device according to the present invention.

FIG. 16A is a graph showing the degradation of sensitivity resulting from the size reduction of a typical CCD cell and FIG. 16B is a table showing for comparison the effects of a hollow package having a conventional structure and a semiconductor image sensing device according to the present invention.

In general, an image sensor is required to have a larger number of pixels at a higher density, while the size reduction of a CCD cell is promoted. However, as the size of the CCD cell is increasingly reduced, the sensitivities of GRB as three primary colors also lower. Among GRB, human eyes are most sensitive to G (Green) at wavelengths of 540 nm. The degradation of the sensitivity of G (Green) with the size reduction of a typical CCD cell is graphed and shown in FIG. 16A. The effects of the hollow package having the conventional structure and the semiconductor image sensing device according to the present invention are shown for comparison in FIG. 16B. When the comparison is made between CCD cells of the same size, the sensitivity of G (Green) improves by about 8%. The sensitivity of each of R (Red) and B (Blue) as the other primary colors also improves by about 4%.

Thus, in the semiconductor image sensing element according to the present invention and the semiconductor image sensing device using the same, the incidence of a reflected light beam or a scattered light beam on the image sensing area from the side surface of the optical member can be prevented by using a simpler structure. In addition, the semiconductor image sensing element and the semiconductor sensing device according to the present invention have excellent properties against optical noise and achieve the significant effect of allowing reductions in the thicknesses and sizes thereof. Moreover, the semiconductor image sensing element and the semiconductor image sensing device according to the present invention also achieve the effect of allowing the lower-cost fabrication thereof since the fabrication processes therefor are simple and easy.

What is claimed is:

1. A semiconductor device comprising:
   a semiconductor element having a first surface and a second surface opposite to the first surface comprising:
      a light receiving area having a plurality of micro-lenses at the first surface; and
      a plurality of electrodes provided on a peripheral area relative to the light receiving area at the first surface;
   an optical member bonded over the micro-lenses via a transparent bonding member;

a light shielding member covering an entire side end plane of the optical member, wherein the plurality of electrodes are exposed from the light shielding member.

2. The semiconductor device of claim 1, wherein the light shielding member is made of a resin.

3. The semiconductor device of claim 1, wherein the light shielding member cuts off visible light.

4. The semiconductor device of claim 1, wherein the side end plane of the optical member tilts relative to the first surface having the light receiving area.

5. The semiconductor device of claim 1, wherein the side end plane of the optical member formed into a rough surface.

6. The semiconductor device of claim 1, further comprising a plurality of bumps each formed on a surface of each of the electrodes on the first surface of the semiconductor element.

7. The semiconductor device of claim 1, wherein the optical member is made of Pyrex glass, Terex glass, quartz, an acrylic resin, or any epoxy resin.

8. A semiconductor module comprising:
the semiconductor device of claim 1 mounted on a mounting substrate via the plurality of electrodes.

9. The semiconductor module of claim 8 further comprising:
a molding resin around a connected portion of the plurality of electrodes and the mounting substrate.

10. The semiconductor module of claim 1, wherein the transparent bonding member is disposed on the micro-lenses and bottom surface of the optical member.

11. A semiconductor device comprising:
a semiconductor element having a first surface and a second surface opposite to the first surface comprising:
an image sensing area having a plurality of micro-lenses at the first surface; and
a plurality of electrodes provided on a peripheral area relative to the image sensing area at the first surface;
an optical member bonded over the micro-lenses via a transparent bonding member;
a light shielding portion covering an entire side end plane of the optical member,
wherein the plurality of electrodes are exposed from the light shielding portion.

12. The semiconductor device of claim 11, wherein the light shielding portion is a light shielding film.

13. The semiconductor device of claim 11, wherein the light shielding portion is a light shielding pattern.

14. The semiconductor device of claim 11, wherein the light shielding portion is made of a resin.

15. The semiconductor device of claim 11, wherein the light shielding portion cuts off visible light.

16. The semiconductor device of claim 11, wherein the side end plane of the optical member tilts relative to the first surface having the image sensing area.

17. The semiconductor device of claim 11, wherein the side end plane of the optical member formed into a rough surface.

18. The semiconductor device of claim 11, further comprising a plurality of bumps each formed on a surface of each of the electrodes on the first surface of the semiconductor element.

19. The semiconductor device of claim 11, wherein the optical member is made of Pyrex glass, Terex glass, quartz, an acrylic resin, or any epoxy resin.

20. The semiconductor module of claim 11, wherein the light shielding portion covers entirely each side end plane of the optical member.

* * * * *